(12) United States Patent
Smith

(10) Patent No.: US 6,198,628 B1
(45) Date of Patent: *Mar. 6, 2001

(54) PARALLEL COOLING OF HIGH POWER DEVICES IN A SERIALLY COOLED EVIRONMENT

(75) Inventor: Grant M. Smith, Bryn Athyn, PA (US)

(73) Assignee: Unisys Corporation, Blue Bell, PA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/198,719

(22) Filed: Nov. 24, 1998

(51) Int. Cl.[7] ............................................ H05H 7/20
(52) U.S. Cl. ............................................ 361/695; 454/184
(58) Field of Search ............................... 361/688–690, 361/694–697, 724, 752; 454/184; 62/259.2

(56) References Cited

U.S. PATENT DOCUMENTS

| 4,126,269 | 11/1978 | Bruges | 236/49 |
|---|---|---|---|
| 4,158,875 | 6/1979 | Tajima et al. | 361/384 |
| 4,528,614 | 7/1985 | Shariff, et al. | 361/379 |
| 4,774,631 | 9/1988 | Okuyama et al. | 361/384 |
| 4,985,804 | 1/1991 | Campbell et al. | 361/384 |
| 5,063,477 | 11/1991 | Paggen et al. | 361/384 |
| 5,218,514 | 6/1993 | Huynh et al. | 361/384 |
| 5,297,004 | 3/1994 | Mazura | 361/690 |
| 5,297,005 | 3/1994 | Gourdine | 361/697 |
| 5,361,188 | 11/1994 | Kondou et al. | 361/695 |
| 5,398,159 | 3/1995 | Andersson et al. | 361/695 |
| 5,456,632 | 10/1995 | Ohtsu et al. | 454/184 |
| 5,559,673 | 9/1996 | Gagnon et al. | 361/695 |
| 5,680,295 | 10/1997 | Le et al. | 361/695 |
| 5,751,549 | * 5/1998 | Eberhart et al. | 361/695 |
| 5,793,608 | * 11/1998 | Winick et al. | 361/695 |

FOREIGN PATENT DOCUMENTS 0 272 961   6/1988   (EP) .

* cited by examiner

*Primary Examiner*—Gregory Thompson
(74) *Attorney, Agent, or Firm*—Rocco L. Adornato; Mark T. Starr; Ratner & Prestia

(57) ABSTRACT

A system is provided for cooling electronic components and for localized cooling of selected electronic components. An air mover is mounted adjacent to an exhaust opening in order to generate a low pressure zone within the cabinet's interior. An inlet opening is defined in a cabinet so that the air mover can generate a serial air flow path extending from the inlet opening to the exhaust opening for cooling of electronic components within the cabinet. At least one secondary opening is defined in the cabinet so that the air mover can generate a parallel air flow path, for cooling of selected electronic components, that extends from the secondary opening and then joins the serial air flow path.

20 Claims, 3 Drawing Sheets

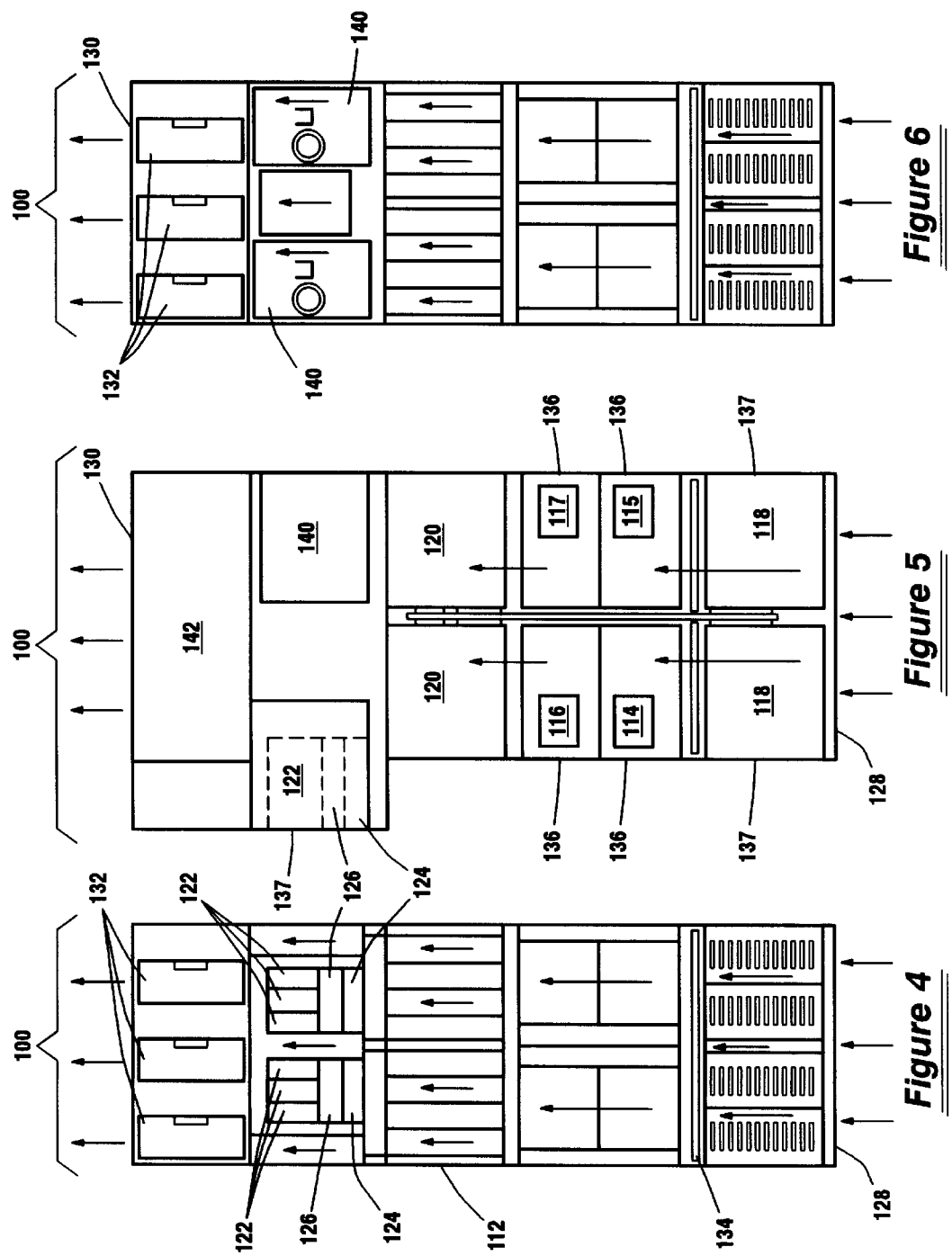

PARALLEL COOLING OF HIGH POWER DEVICES IN A SERIALLY COOLED EVIRONMENT

FIELD OF THE INVENTION

This invention relates to a system for cooling electronic equipment. In particular, it relates to the parallel cooling of high power devices in a serially cooled environment.

BACKGROUND OF THE INVENTION

There is an ever-increasing need for electronic devices and systems having improved reliability. One potential source of failure for an electronic system is its cooling system. The electronic components of such systems typically generate a considerable amount of heat in an enclosed or semi-enclosed space. It is often necessary to provide a cooling system in order to prevent temperature gradients that could compromise the function of such electronic components.

One method of cooling is the use of an air mover such as a fan or impeller in order to establish air flow across the electronic components. Such air flow facilitates the dissipation of generated heat by convection heat transfer. In some cooling systems, multiple air movers are mounted in a bank arrangement wherein each of the air movers moves a portion of the air that is being used to cool the electronic system, and the air movers in combination provide the cooling capacity necessary to cool the electronic system.

One or more air movers are sometimes mounted to move air along an air flow path to cool electronic components that are oriented in series along that path. This is not to say that the electronic components are connected in series or arranged directly along the air flow path in the geometric sense; instead, such serial orientation refers to the general movement of the air flow across the electronic components in such a way that portions of the same stream of air bring about the required heat transfer from substantially all of the electronic components.

In such serially cooled environments, there is often an accumulation of heat as the air moves across the electronic components. In other words, the temperature gradient increases along the air flow path so that the temperature of exhaust air can be substantially higher than that of the inlet air.

In recent years, there has been a trend in the high end server market to utilize standard personal computer (PC) components to assemble larger server systems. The cost associated with the development of custom components has become increasingly prohibitive when compared to the increasing performance of PC's. Moreover, the large volume of PC's keeps the cost of these components at a minimum.

As the frequency of the processors used in such server systems continues to increase, the power level of the components continues to climb. Also, as the speeds of the components increase, the minimization of the distance between the components becomes more and more critical. The increased power level and reduced distance between components are factors that combine to make it very difficult to cool such components effectively. Although with single processor machines such as PC's even high-powered processors can be fairly easily cooled with the use of active fan sinks on the processors, the reliability and serviceability of the such active components prohibit their use in a high end server. For example, in large servers it is quite challenging to package components such as those designed for PC's into large systems. Since the geometry of such components was developed with the PC in mind, they may not be conducive to packaging into large, densely packed, high end servers.

Typically, large high end servers include printed circuit boards that are arranged in card racks of parallel banks of cards. Such cards can be cooled relatively easily by blowing or drawing air through the banks of cards. Serially cooled system cabinet level coolers can provide a cost-effective means to cool an entire enclosure. Also, such cabinet level cooling schemes make it easy to provide redundant cooling for the system. Furthermore, such cooling schemes make it easier to provide hot maintenance of the cooling system.

However, using PC components, the geometry's of the various assemblies end up in many different orientations that make traditional serial cooling techniques difficult or impossible. Also, these high end servers use multiple processors to gain performance and such processors all need to be kept very close to each other, close to the cache, and to the bus interface devices and the main system memory which can create high power density in tightly-packed areas.

Various cooling schemes have been proposed over the years. For example, in U.S. Pat. No. 4,528,614, Shariff et al. describe switchgear units housed in a cabinet having an integral air-ventilation duct system of modular snap-fitting construction having an air intake opening at the bottom of the cabinet, an air exhaust opening at the top of the cabinet, and branch ducts that communicate with tandem compartments that are in stacked relationship. The ventilation duct assemblies have a vertically extending duct and a series of transverse branch ducts.

In U.S. Pat. No. 4,774,631, Okuyama et al. describe a cooling structure having shelf units wherein a fan unit is disposed on top of each shelf to constitute a separate cooling block. The fan unit of each cooling block generates a cooling wind which is passed linearly through the shelf unit from the bottom to the top as well as introducing atmosphere through vent holes formed in side face portions of each fan unit. The flow rate of the cooling wind will be gradually increased as the cooling wind proceeds to the upper cooling blocks.

In U.S. Pat. No. 5,361,188, Kondou et al. describe a cooling apparatus having a comb-tooth shaped duct for defining flow paths along substrates to introduce cooling air to each integrated circuit device. The duct includes small holes at positions corresponding to the integrated circuit devices and having open areas corresponding to the heating values of the integrated circuit devices.

Despite the various attempts to develop improved cooling systems in the past, there remains a need for an improved cooling system for use in connection with electronic systems such as large, densely packed high end servers. Accordingly, it is an object of this invention to provide an improved cooling system that can be used in order to improve the reliability, availability, and serviceability of such electronic systems.

SUMMARY OF THE INVENTION

This invention provides a system for cooling electronic components that are mounted throughout an interior region of a cabinet. The system is adapted for localized cooling of selected electronic components. The system includes an air mover such as a blower, impeller or fan that is mounted proximal to an exhaust opening at an end portion of the cabinet. The air mover is positioned to generate a low pressure zone within the cabinet.

An inlet opening is provided in the cabinet toward an opposite end portion of the cabinet through which air is drawn into the interior of the cabinet. The air mover generates a serial air flow path that extends from the inlet opening to the exhaust opening for cooling of the electronic components mounted in the cabinet. Also provided is a secondary opening in the cabinet through which air additional is drawn into the interior of the cabinet. The air mover generates a parallel air flow path extending from the secondary air opening and joining the serial air flow path for cooling of selected electronic components that are mounted along or adjacent to the parallel air flow path.

The exhaust opening of the system according to this invention is preferably defined in a top portion of the cabinet and the inlet opening is preferably defined in a bottom portion. In an exemplary embodiment, the inlet opening and the secondary opening are sized to control the proportion of air flowing along the parallel air flow path and the serial air flow path.

The system can also include a plurality of secondary openings so that the air mover generates plural parallel air flow paths, one extending from each of the secondary openings and joining the serial air flow path. In a system utilizing multiple secondary openings, such secondary openings are preferably sized to control the proportion of air flowing along the serial air flow path and along each of the parallel air flow paths. Also, in a system utilizing multiple secondary openings, each of the selected electronic components are preferably mounted along one of the parallel air flow paths.

The air mover of the system according to this invention can be a part of a cooling module that is removable and replaceable with respect to the cabinet. Such a cooling module can include multiple air movers.

BRIEF DESCRIPTION OF THE DRAWINGS

FIG. 4 is a schematic front view of another electronic assembly incorporating a cooling system according to this invention.

FIG. 5 is a schematic side view of the electronic assembly illustrated in FIG. 4.

FIG. 6 is a schematic rear view of the electronic assembly illustrated in FIG. 4.

DETAILED DESCRIPTION OF THE INVENTION

Figure 3:
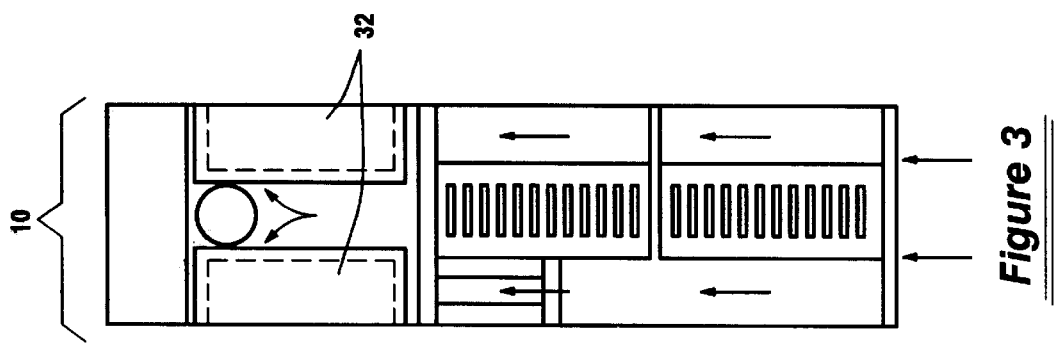
FIG. 3 is a schematic rear view of the electronic assembly illustrated in FIG. 1.

This invention will now be described with reference to particular embodiments selected for illustration in the drawings. It will be understood that the invention is not limited to the specific embodiments selected for illustration. It is instead defined separately in the appended claims. Also, the drawings are not to any particular scale or proportion.

Generally speaking, this invention permits the use of a system level, redundant, hot replaceable cooling scheme in order to provide cooling for both very high powered components as well as to allow for unusual geometry's. In one form, this invention employs a system level evacuation air cooling scheme. It can be enclosed in an industry standard rack mount cabinet. A hot replaceable cooling system can also be housed in connection with the cabinet, perhaps at the top of the cabinet. In such a configuration, this system provides a standard, serially cooled environment for the complete computer system.

However, it has been discovered that, in the processor area, the combination of high powered components and the tight packaging of such components can exceed the capability of standard serial cooling schemes. As the air crosses these high powered devices, the air temperature is significantly increased and this increased temperature is then passed on to the next high powered device in the stack. With this arrangement, huge volumes of cooling air could be required to reduce the temperature rise enough to cool all of the devices in the stack. Providing such additional volumes of cooling air would however create unwanted noise, size and cost.

It has been discovered according to this invention that the high powered devices are beneficially cooled by providing an additional inlet vent for each of the high powered devices. The high powered devices that require supplemental cooling can be selected based on their power dissipation characteristics, which are often provided by their manufacturers in terms of WATTS. The main cabinet cooling system generates a low pressure area or zone inside the cabinet. This low pressure causes air to be drawn into the system through any cabinet opening. Accordingly, each added vent provides a parallel path for cooling air across the component. This parallel flow of air is then joined with the main cabinet serial air flow up through the remainder of the system. By sizing the vent area, it has been discovered that each critical component can be made to receive the appropriate amount of air at the coolest temperature available.

It has further been discovered that the cooling system according to this invention can be used to cool unusually shaped or placed components. For example, standard PC PCI-based input/output cards are frequently designed to be installed in the rear of a PC chassis. Accordingly, they are normally plugged into a motherboard in the rear of a PC chassis. In such an arrangement, they have short interconnects to the system bus and they have external connections out of the chassis in the rear. This arrangement does not however work in a large serially cooled system. As it will be understood, if the cards are packaged in the normal arrangement where the cards are parallel to the air stream, then the motherboard will be positioned perpendicular to the main cooling stream which would block the flow path. If instead they were turned 90°, this places the PCI cards perpendicular to the air flow path which would also block the main system air flow path.

The system according to this invention provides a solution to this problem. Specifically, the external face of the connector area is vented in order to provide an air flow path into the system that is at an angle (perhaps perpendicular) to the main system air flow path. This parallel air stream then follows perpendicular to the main air flow stream, across the input/output cards and then into the main cabinet air flow path where it helps to cool the balance of the system in a serial manner.

It has further been discovered that this system is beneficially contained in the top of an electronic cabinet that mostly houses banks of parallel cards that contain integrated circuits. The primary air flow path comes into the cabinet through a filter located in the bottom of the cabinet. The air flows through the equipment where it absorbs the system heat. It is then exhausted out through the top of the cabinet. The system also contains multiple vents to the ambient air as will be described in detail later. These vents are of a specific size in order to regulate the volume of air drawn into the cabinet.

Figure 2:
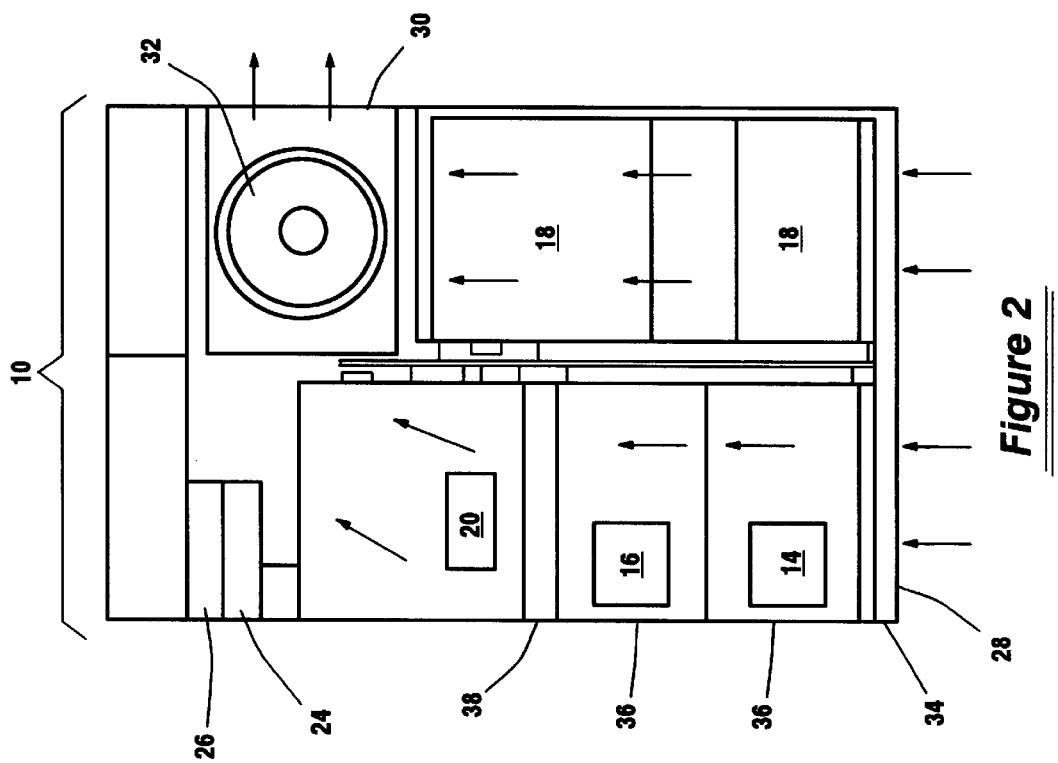
FIG. 2 is a schematic side view of the electronic assembly illustrated in FIG. 1.
Figure 1:
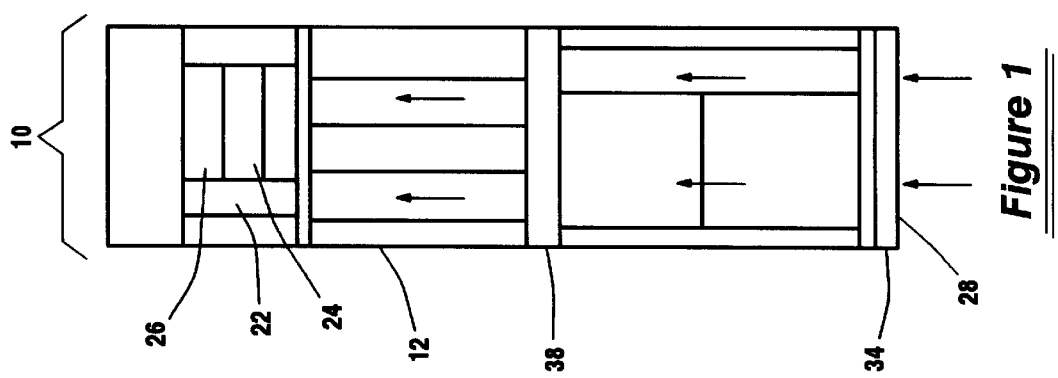
FIG. 1 is a schematic front view of an electronic assembly that includes a cooling system according to this invention.

Turning now to the specific embodiments selected for illustration in the drawings, an electronic assembly such as a server is generally designated by the numeral "10" in FIGS. 1–3. Referring to FIGS. 1–3 generally, electronic assembly 10 includes a cabinet 12 which may be of modular construction. In other words, various portions of electronic assembly 10 can be provided by separate manufacturers in separate modules for assembly and later installation. Mounted within cabinet 12 are a series of electronic components or subassemblies which generate heat during use and require cooling air in order to maintain a proper operation temperature. As is best shown in FIG. 2, electronic assembly 10 includes a "hot part" 14 and a "hot part" 16. Such hot parts can be components or assemblies of components such as processors or the main system memory or other high power devices. Such hot parts 14, 16 generate significant heat that must be dissipated in order to maintain the components at a desirable temperature range. Also mounted within cabinet 12 is a series of PCI modules including interface cards which in this embodiment are mounted in a plane that is parallel to a base of the cabinet 12.

A power module 20 is also mounted within cabinet 12. Above power module 20 are a series of drives including a disc drive 22, a CD ROM drive 24, and a tape drive 26.

As shown in FIGS. 1–3, an inlet 28 is provided at the bottom surface of cabinet 12. An air filter 34 is provided at the inlet 28 in order to remove dust and other unwanted particles from the air as it enters the cabinet 12. At an opposite end portion of cabinet 12 is an exhaust opening 30 and an air mover 32 that is positioned adjacent or proximal to exhaust opening 30. Air mover 32 can be an impeller, a blower, or a fan as well as any other device capable of generating air flow.

As indicated by the arrows in FIGS. 1–3, air mover 32 generates a serial air flow path upwardly through cabinet 12 extending between inlet opening 28 and exhaust opening 30. This is the main air flow path through cabinet 12 and provides general cooling of the electronic components that are mounted within cabinet 12. As indicated at the left-hand side of the FIG. 2, a pair of secondary inlet ports 36 is provided adjacent to hot parts 14 and 16 in order to provide an inlet for cooling air and to provide localized cooling of hot parts 14 and 16. Filters can optimally be provided at secondary inlets 36.

Air mover 32 generates air flow inwardly, by creating a low pressure zone within cabinet 12, so as to produce parallel air flow paths extending from each secondary opening 36 and joining the serial air flow path that extends upwardly through cabinet 12. Hot parts 14 and 16 are positioned along the parallel air flow paths in order to enjoy the benefit of their cooling affect. The air flowing along the parallel air flow paths joins up with the air flowing along the serial flow path in order to provide additional cooling effect to other downstream components within cabinet 12.

Also within cabinet 12 is an "air expander" 38, which in this embodiment is located above the hot parts 14, 16 but below the power module 20. Air expander 38 provides an intermediate plenum which allows the air to equalize at this point in the chamber or cabinet 12. In other words, air expander 38 helps to establish a substantially constant pressure zone.

It will be understood in view of FIGS. 1–3 that the singular air mover 32 is capable of drawing cooling air into cabinet 12 in such a way as to provide general cooling to electronic components (along a serial air flow path) as well as localized cooling of hot parts that are positioned along parallel air flow paths. The parallel air flow paths in this embodiment are substantially perpendicular to the serial air flow path, at least proximal to their respective secondary inlets 36.

Referring now to FIGS. 4–6, another embodiment of an electronic assembly including a cooling system according to this invention is generally designated by the numeral "100". Electronic assembly 100 such as a server, is similar to electronic assembly 10 except that it is better suited for the use of a cooling module that can be separately manufactured for attachment to a cabinet such as cabinet 112. Mounted within cabinet 112 is a series of "hot parts" 114, 115, 116, 117. Also mounted in cabinet 112 is a series of PCI modules 118 each including a plurality of interface cards with faces that extend substantially parallel to the base of cabinet 112. Above hot parts 114–117 are power modules 120. Also located within cabinet 112 are various drives including multiple disc drives 122, a tape drive 126, and a CD ROM drive 124.

At the bottom of cabinet 112 is provided an inlet opening 128. Spaced above inlet 128 (above PCI modules 118) is a filter 134 adapted to remove small particles such as dust from the incoming air. At the opposite, top end of cabinet 112 is an exhaust opening 130 for the exhaust of the cooling air. The exhaust opening 130 is part of a cooling module 142 that includes a plurality of impellers 132 (six in this embodiment). The impellers 132 are oriented to generate upward flow of air out through exhaust opening 130. Impellers 132 can be modular to permit removal and replacement with respect to cabinet 112.

A/C entry modules 140 are also provided in cabinet 112. Again, such modules can be manufactured separately for modular assembly and installation.

As is best illustrated in FIG. 5, cabinet 112 includes a plurality of secondary openings 136, one positioned adjacent to each hot part 114, 115, 116, 117. Also, incidental secondary openings 137 are provided adjacent to the PCI modules 118. Another incidental secondary opening 137 is provided at the disc drive 122.

As will be clearly understood from review of FIGS. 4–6, the impellers 132 of cooling module 142 generate an upward serial air flow path that extends between inlet opening 128 at the bottom of cabinet 112 through to the exhaust opening 130 at the top of cabinet 112. This serial air flow path provides for general cooling of all of the components that are mounted within cabinet 112.

The secondary openings 136 provide access for air to be drawn into the interior of cabinet 112, also by means of impellers 132 of cooling module 142. The impellers 132 generate parallel air flow paths that extend inwardly from secondary openings 136 and that then join the serial air flow path to contribute to the cooling of downstream components that are mounted within cabinet 112.

As a point of clarification, it should be noted that the use of the term "parallel" is not intended to indicate that the paths are geometrically parallel to one another. Instead, it is merely used to broadly indicate that the parallel air flow paths are at least partially distinct from one another and from the serial air flow path. In the embodiment illustrated in FIG. 5, it will be seen that the parallel air flow paths extending inwardly from secondary openings 136 are generally perpendicular, at least at the outset, to the serial air flow path extending upwardly from inlet opening 128 to exhaust opening 130. Nevertheless, the serial and parallel air flow paths are considered to be parallel in that they extend at least partially along distinct axes.

The incidental air flow inwardly to cabinet 112 through secondary openings 137 provide additional cooling at the PCI modules 118. As shown in FIGS. 4 and 6, the PCI modules 118 include interface cards which extend substantially parallel to the base of cabinet 112. Accordingly, the interface cards themselves tend to partially block the flow of air that is provided along the serial air flow path extending between inlet opening 128 and exhaust opening 130. Accordingly, the secondary openings 137 provide for the ingress of air flow between the interface cards to provide cooling wherein the air flow along such parallel air flow paths joins later with the serial air flow path to flow upwardly through the cabinet 112 for cooling of other components. Similarly, air flow inwardly through a secondary opening 137 at the location of the disc drive 122 also provides cooling along a parallel air flow path in that location of cabinet 112. Such parallel air flow paths later join the serial air flow path which is flowing toward the exhaust opening 130.

Figure 7:
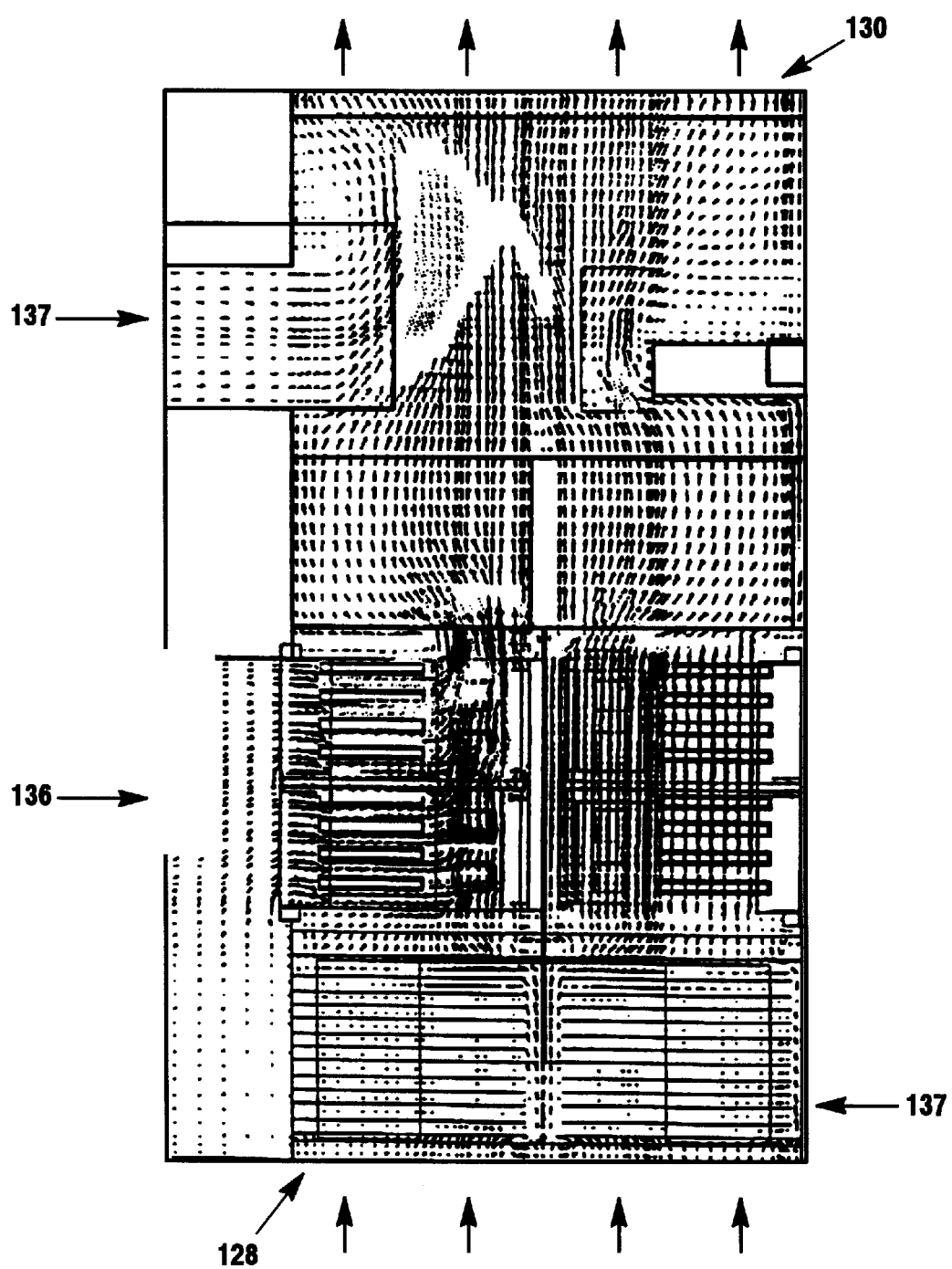
FIG. 7 is a cross-sectional side view of the electronic assembly as shown in FIG. 5, but including arrows indicating the flow of air through the electronic assembly.

FIG. 7 is a computer-generated diagram which models the expected air flow characteristics within cabinet 112 of the embodiment illustrated in FIGS. 4–6. As illustrated in FIG. 7, there is a general flow pattern along a serial air flow path that extends from the inlet to the exhaust. FIG. 7 also illustrates how the orientation of various components within the cabinet 112 can impact the paths of cooling air flow. For example, see the reduced air flow between the interface cards at the PCI modules 118 where the vertical component of air flow is minimal and the cooling air is provided instead by the secondary openings 137. A similar affect is seen with respect to the hot parts 114, 115, 116, 117 as well as the various drives 122, 124, 126.

As illustrated in FIG. 7, the cooling system according to this invention provides both general cooling of components positioned throughout the interior of cabinet 112 (along a serial air flow path) as well as localized cooling of parts that are known to generate more heat (along parallel air flow paths). This has proven to be quite advantageous in electronic systems such as servers, especially where standard PC components are used so as to populate smaller areas with heat-generating components and to orient components in such a way that can block cooling air flow.

The size of the various openings can be selected in order to regulate the amount of air flow into the cabinet through the respective openings. In other words, the various openings can be sized to establish a desired proportion of air flow along various paths. Larger openings will of course permit greater air flow and smaller openings will constrict the air flow.

More specifically, the amount of air flow can be quantified in terms of its velocity (feet/minute or meters/second) or flow rate (cubic feet/minute or liters/second). It has been discovered that air velocity is an important factor in the transfer of heat from electronic components into the air stream and that air flow rate is an important factor in the transfer of heat from the interior of the electronic system to its exterior.

Given that the air flow rate into a system corresponds to the air flow rate out from the system, it has been discovered that the incoming air flow rate can be beneficially apportioned among strategically sized and located inlet openings in order to provide adequate localized cooling depending upon the cooling requirements for the respective components. For example, openings should be located proximal to heat generating components that are densely packed or that have the highest power dissipation characteristics. Also, the size of the openings should correspond to the proportion of air flow needed to cool a particular component or group of components. The openings can be made adjustable in size by the use of flaps, sliding doors, louvers, or other structures to provide flexibility and adjustability features.

Selected inlet opening locations and sizes can be confirmed to ensure proper cooling by the use of computational fluid dynamics (CFD) systems, which are well known. By entering the selected opening sizes and locations as well as information relating to cabinet and component mounting geometries, component power dissipation characteristics, and air mover characteristics, the CFD system can be used to model the air flow through the system so that any necessary adjustments can be made.

While this invention has been described with reference to specific embodiments selected for illustration herein, it is contemplated that many modifications and variations of the embodiments described can be made without departing from the spirit or scope of this invention. For example, the number or size of inlet openings is not critical to the invention. Although it is preferred for there to be one main intake opening and at least one secondary opening, there may be any number of openings and the openings may be oriented at any surface of the cabinet.

Also, the air mover utilized according to this invention can be a blower, a fan, an impeller or any other suitable means for generating air flow. The air mover can be part of a modular assembly adapted for connection to or within the cabinet, or the air mover can be integrally mounted within the cabinet. The cabinet itself can be a chassis or any housing suitable for electronic components. The cabinet can be modular or of a one-piece construction. Additional modifications and variations can be made without departing from the spirit or scope of this invention, which is defined separately in the appended claims.

What is claimed:

1. An apparatus adapted for general cooling of electronic components and for localized cooling of selected electronic components, said apparatus comprising:

cabinet enclosing said electronic components and said selected electronic components;

an air mover connected to said cabinet and positioned to urge air flow toward an exhaust opening defined in said cabinet;

an inlet opening defined in said cabinet through which air is drawn into said interior of said cabinet, said air mover generating a serial air flow path extending from said inlet opening toward said exhaust opening for general cooling of said electronic components enclosed in said cabinet;

secondary openings defined in said cabinet through which air is drawn into said interior of said cabinet, said secondary openings each being positioned proximal to at least one of said selected electronic components;

said air mover generating parallel air flow paths extending from said secondary openings, each of said parallel air flow paths extending adjacent said at least one selected electronic component, and then joining said serial air flow path, for localized cooling of said at least one selected electronic component.

2. The system defined in claim 1, said exhaust opening being defined in an end portion of said cabinet.

3. The system defined in claim 2, said inlet opening being defined in an opposite end portion of said cabinet.

4. The system defined in claim 1, said inlet opening and said secondary opening being sized to control the proportion of air flowing along said parallel air flow path and said serial air flow path.

5. The system defined in claim 1, said inlet opening and said secondary openings being sized to control the proportion of air flowing along said serial air flow path and each of said parallel air flow paths.

6. The system defined in claim 1, each of said selected electronic components being mounted in or proximal to one of said parallel air flow paths.

7. The system defined in claim 1, further comprising an air filter positioned to extend at least one of said parallel air flow paths or said serial air flow path.

8. The system defined in claim 1, said air mover being selected from the group consisting of an impeller, a blower, and a fan.

9. The system defined in claim 1, said air mover being removable and replaceable with respect to said cabinet.

10. The system defined in claim 1, further comprising a cooling module in which said air mover is mounted.

11. The system defined in claim 1, said air mover being positioned to generate a low pressure zone within at least a portion of the interior of said cabinet.

12. An apparatus adapted for general cooling of electronic components and for localized cooling of selected electronic components, said apparatus comprising:

a cabinet enclosing said electronic components and said selected electronic components;

an air mover connected to said cabinet and mounted proximal to an exhaust opening defined in an end portion of said cabinet;

an inlet opening defined in an opposite end portion of said cabinet through which air is drawn into said interior of said cabinet, said air mover generating a serial air flow path extending from said inlet opening toward said exhaust opening for general cooling of said electronic components enclosed in said cabinet;

secondary openings defined in said cabinet through which air is drawn into said interior of said cabinet, said secondary openings each being positioned proximal to at least one of said selected electronic components;

said air mover generating parallel air flow paths extending from said secondary openings, each of said parallel air flow paths extending adjacent said at least one selected electronic component, and then joining said serial air flow path, for localized cooling of said at least one selected electronic component; and said inlet opening and said secondary opening being sized to control the proportion of air flowing along said parallel air flow path and said serial air flow paths.

13. The system defined in claim 12, said exhaust opening being defined in a top portion of said cabinet.

14. The system defined in claim 13, said inlet opening being defined in a bottom portion of said cabinet.

15. The system defined in claim 12, said inlet opening and said secondary openings beings sized to control the proportion of air flowing along said serial air flow path and each of said parallel air flow paths.

16. The system defined claim 12, each of said selected electronic components being mounted in or proximal to one of said parallel air flow paths.

17. The system defined in claim 12, said air mover being removable and replaceable with respect to said cabinet.

18. The system defined in claim 12, said air mover being positioned to generate a low pressure zone within at least a portion of the interior of said cabinet.

19. An apparatus adapted for general cooling of electronic components and for localized cooling of selected electronic components, said apparatus comprising:

a cabinet enclosing said electronic components and said selected electronic components;

an air mover connected to said cabinet and mounted proximal to an exhaust opening defined in a top portion of said cabinet, said air mover being positioned to generate a low pressure zone within the interior of said cabinet;

an inlet opening defined in a bottom portion of said cabinet through which air is drawn into said interior of said cabinet, said air mover generating a serial air flow path extending from said inlet opening toward said exhaust opening for general cooling of said electronic components enclosed in said cabinet;

secondary openings defined in said cabinet through which air is drawn into said interior of said cabinet, said secondary openings being positioned proximal to said selected electronic components;

said air mover generating a parallel air flow path extending from each of said secondary openings, extending adjacent said selected electronic components, and then joining said serial air flow path, for localized cooling of said selected electronic components enclosed in said cabinet and positioned along said parallel air flow paths and proximal to said secondary openings;

said inlet opening and said secondary openings being sized to control the proportion of air flowing along said serial air flow path and each of said parallel air flow paths.

20. The system defined in claim 19, said air mover being removable and replaceable with respect to said cabinet.

* * * * *